(12) United States Patent
Dickey

(10) Patent No.: US 11,391,805 B2
(45) Date of Patent: Jul. 19, 2022

(54) SYSTEMS AND METHODS FOR CURRENT SENSE RESISTOR BUILT-IN-TEST

(71) Applicant: Hamilton Sundstrand Corporation, Charlotte, NC (US)

(72) Inventor: John A. Dickey, Caledonia, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 156 days.

(21) Appl. No.: 16/409,650

(22) Filed: May 10, 2019

(65) Prior Publication Data
US 2020/0355775 A1    Nov. 12, 2020

(51) Int. Cl.
*G01R 35/00* (2006.01)
*G01R 31/40* (2020.01)
*H01H 47/00* (2006.01)

(52) U.S. Cl.
CPC ............. *G01R 35/00* (2013.01); *G01R 31/40* (2013.01); *H01H 47/002* (2013.01)

(58) Field of Classification Search
CPC ................................. G01R 35/00; G01R 31/40
See application file for complete search history.

(56) References Cited

U.S. PATENT DOCUMENTS

| 4,156,837 | A | * | 5/1979 | Baker | ................ | H03K 17/0826 323/289 |
| 4,174,496 | A | * | 11/1979 | McFall | ................... | G05F 1/455 323/235 |
| 4,709,160 | A | * | 11/1987 | Kinoshita | .......... | H03K 17/0826 323/285 |
| 6,421,214 | B1 | | 7/2002 | Packard et al. | | |
| 7,616,413 | B2 | | 11/2009 | Lee | | |
| 8,599,523 | B1 | | 12/2013 | Ostrovsky et al. | | |
| 8,847,656 | B1 | * | 9/2014 | A | ......................... | H03K 17/162 327/310 |

(Continued)

FOREIGN PATENT DOCUMENTS

WO            17140874 A1    8/2017

OTHER PUBLICATIONS

Extended European Search Report dated Jun. 26, 2020, issued during the prosecution of European Patent Application No. EP 19210388.5.

(Continued)

*Primary Examiner* — Paresh Patel
(74) *Attorney, Agent, or Firm* — Locke Lord LLP; Scott D. Wofsy; Alicia J. Carroll

(57) ABSTRACT

A solid-state power controller (SSPC) system with a built-in-test circuit includes a SSPC field-effect transistor (FET) switch. The system includes a current sense resistor electrically connected to the SSPC FET switch in series. A resistor is electrically connected to the current sense resistor in series. A switch is electrically connected to the resistor in series. A method for testing a current sense resistor value in a solid-state power controller (SSPC) system includes determining a cycle count, generating a new bit with a processing unit, and outputting the new bit to a switch operatively connected to the processing unit to at least one of turn the switch on or turn the switch off. The method includes reading a load current with the processing unit to determine whether a current sense resistor electrically coupled to the switch is operating within a desired resistance range.

5 Claims, 6 Drawing Sheets

(56) References Cited

U.S. PATENT DOCUMENTS

| | | |
|---|---|---|
| 9,411,021 B2 | 8/2016 | Suchoff |
| 9,948,087 B2 | 4/2018 | Haines et al. |
| 10,069,292 B2 | 9/2018 | Li et al. |
| 10,224,812 B1 | 3/2019 | Sen et al. |
| 2006/0200688 A1 | 9/2006 | Tofigh et al. |
| 2009/0021874 A1* | 1/2009 | Divito .................... H02H 3/023 361/57 |
| 2012/0049935 A1 | 3/2012 | Greither |
| 2014/0103990 A1* | 4/2014 | Holley ............... G01R 31/3277 327/427 |
| 2014/0191768 A1 | 7/2014 | Engl |
| 2015/0048839 A1 | 2/2015 | Desrosiers |
| 2015/0138681 A1 | 5/2015 | Mayes |
| 2015/0219696 A1 | 8/2015 | Eckrich et al. |
| 2016/0149400 A1* | 5/2016 | Dickey .................... H02J 1/10 361/93.1 |
| 2016/0327917 A1* | 11/2016 | Dickey .................... G05B 9/02 |
| 2018/0145498 A1 | 5/2018 | Handy et al. |

OTHER PUBLICATIONS

Ahmed M M R, "Improving connection and disconnection of a small scale distributed generator using solid-state controller", 2008 13th International Power Electronics and Motion Control Conference: [EPE-PEMC 2008], Poznan, Poland, Sep. 1-3, 2008, pp. 1866-1871.

Friedman S: "Robust/low cost SSPCs are finally available" ,Aerospace and Electronics Conference, 1997. NAECON 1997, Proceeding of the IEEE 1997 National, Dayton, Ohio, Jul. 14-17, 1997, NY, NY, IEEE, US, vol. 1, pp. 145-150.

EP Communication pursuant to Art 94(3) EPC dated Jun. 11, 2021, issued during the prosecution of European Patent Application No. EP 19210388.5, 5 pages.

* cited by examiner

SYSTEMS AND METHODS FOR CURRENT SENSE RESISTOR BUILT-IN-TEST

BACKGROUND OF THE INVENTION

1. Field of the Invention

Embodiments of the invention relate to solid-state power controllers and more particularly to current sense resistors for use therewith.

2. Description of Related Art

A solid-state power controller (SSPC) can include a current sense resistor to determine a load current measurement for the SSPC. In certain applications, a test of the current sense resistor may be required to determine whether it is properly functioning. The low resistance values of the current sense resistor tend to make it difficult to determine whether or not the current sense resistor is or is not properly functioning. Moreover, the values of the current sense resistor are susceptible to being corrupted by load noise from the SSPC load.

Such conventional methods and systems have generally been considered satisfactory for their intended purpose. However, there is still a need in the art for improved systems and methods for testing current sense resistors. There is also a need for such systems that are easy to make and use. The present disclosure provides a solution for these needs.

SUMMARY OF THE INVENTION

A solid-state power controller (SSPC) system with a built-in-test circuit includes a SSPC field-effect transistor (FET) switch. The system includes a current sense resistor electrically connected to the SSPC FET switch in series. A resistor is electrically connected to the current sense resistor in series. A switch is electrically connected to the resistor in series.

The system can include a feed input electrically connected to the SSPC FET switch. The system can include a load output electrically connected between the current sense resistor and the resistor. The system can include a first current sense lead extending from between the SSPC FET switch and the current sense resistor and a second current sense lead extending from between the current sense resistor and the resistor. A processing unit can be electrically coupled to the first and second current sense leads. The processing unit can be electrically coupled to the switch. The processing unit can be electrically coupled to the SSPC FET switch.

In accordance with another aspect, a method for testing a current sense resistor in a solid-state power controller (SSPC) system includes, generating a new bit with a processing unit, and outputting the new bit to a switch operatively connected to the processing unit to at least one of turn the switch on or turn the switch off. The method includes reading a current with the processing unit to determine whether a current sense resistor electrically coupled to the switch is operating within a desired resistance range.

The new bit can be one of a sequence of bits in a polynomial pseudo random sequence. The method can include determining a cycle count. In certain embodiments, the method includes adding the current reading to an accumulator if the new bit is 1. The method can include subtracting the current reading from the accumulator if the new bit was zero. The switch can be a leakage switch. When the switch is "ON," the current read can be equivalent to a leakage current plus a load current. The method can include incrementing the cycle count. The method can include determining whether the cycle count is greater or equal to a terminal value. The method can include generating another new bit if the cycle count is less than the terminal value. The method can include determining whether an accumulator in the processing unit is within a tolerance threshold if the cycle count is equal to or greater than the terminal value. The method can include decrementing an error count if the accumulator is within the tolerance threshold. The method can include incrementing an error count if the accumulator is outside of the tolerance threshold. Incrementing the error count can include incrementing the error count twice. The method can include determining whether a total error count is greater or less than a pre-determined error count threshold. The method can include reporting an error and turning off a load to a solid-state power controller (SSPC) system if the total error count is greater than the pre-determined error count threshold. The method can include clearing the cycle count if the error count is less than the pre-determined error count threshold.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1A:
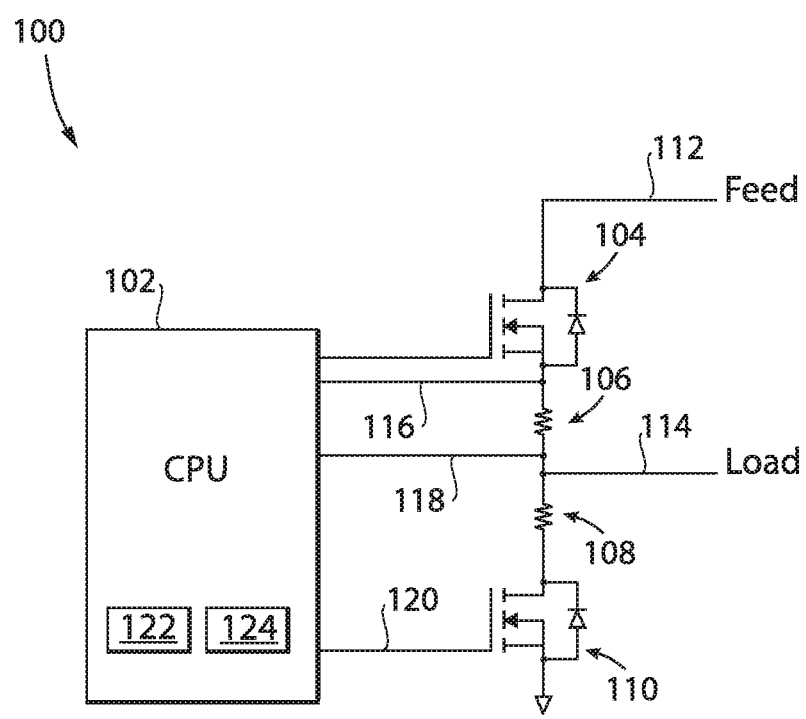
FIG. 1A is a schematic depiction of a solid-state power controller (SSPC) system with a built-in-test circuit constructed in accordance with an embodiment of the present disclosure, showing a leakage load resistor and leakage switch.

Reference will now be made to the drawings wherein like reference numerals identify similar structural features or aspects of the subject disclosure. For purposes of explanation and illustration, and not limitation, an embodiment of a solid-state power controller (SSPC) system in accordance with the disclosure is shown in FIG. 1A and is designated generally by reference character 100. Other embodiments of systems in accordance with the disclosure, or aspects thereof, are provided in FIGS. 2-6, as will be described. The systems and methods described herein can be used to provide real-time testing of the current sense resistor value while the SSPC system is operating a load.

As shown in FIG. 1A, an SSPC system 100 with a built-in-test circuit includes a SSPC field-effect transistor (FET) switch 104. Switch 104 can include one or more SSPC field-effect transistors arranged in parallel with one another. The SSPC FET switch 104 controls power between a feed input 112 and a load output 114. The system 100 includes a current sense resistor 106 electrically connected to the SSPC FET switch 104 in series. A resistor, e.g. a leakage load resistor 108, is electrically connected to the current sense resistor 106 in series. A switch 110, e.g. a leakage switch 110, is electrically connected to the resistor in series. The leakage load resistor 108 and the leakage switch 110 make up a built-in-test circuit for system 100. Leakage load resistor 108 and leakage switch 110 offer a compact built-in-test circuit, offering benefits to system 100. Moreover, where leakage load resistor 108 and leakage switch 110 are used in system 100, the circuit is utilizing existing components that were sometimes already there for reducing the effect of leakage currents when the SSPC switch 104 is off. The leakage switch 110 includes at least one FET, or the like.

Figure 1B:
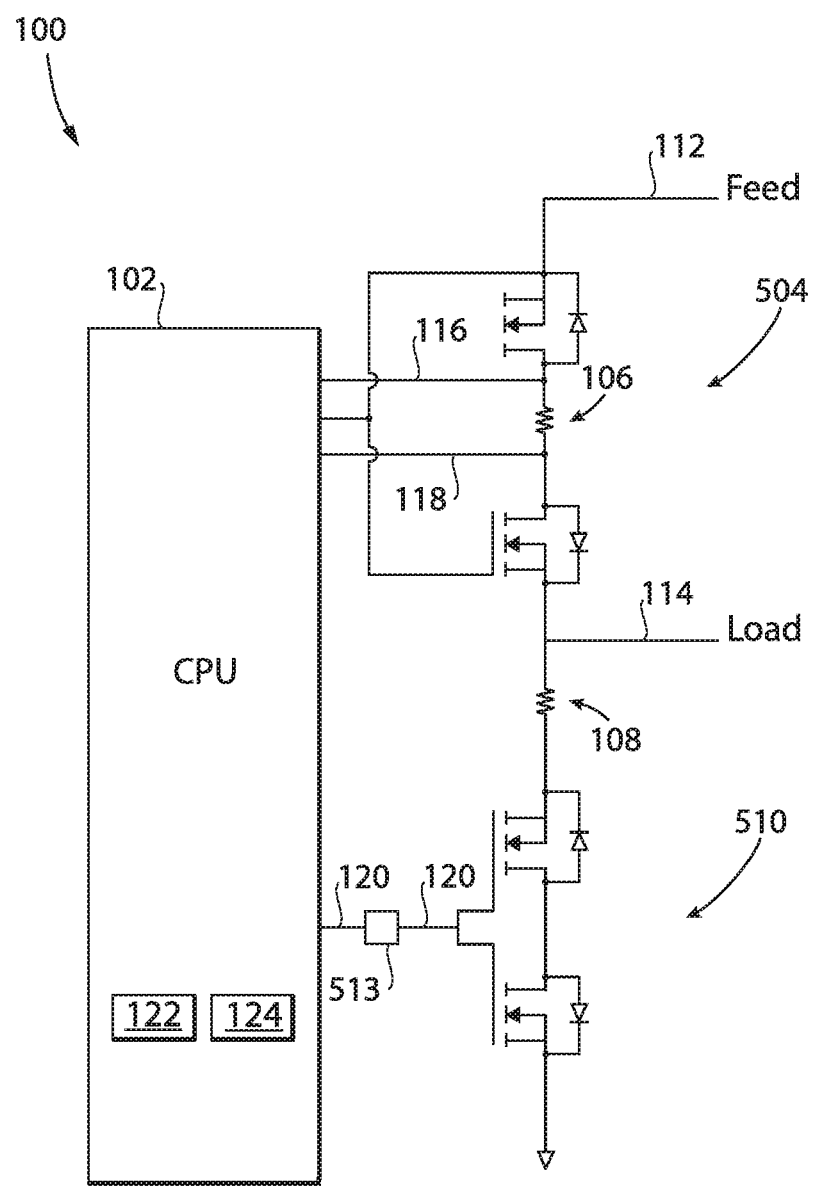
FIG. 1B is a schematic depiction of a solid-state power controller (SSPC) system with a built-in-test circuit constructed in accordance with an embodiment of the present disclosure, showing AC circuitry from the leakage load resistor and leakage switch.

Those skilled in the art will readily appreciate that, while SSPC system 100 of FIG. 1A is shown with circuitry for a DC application, system 100 can also be used for an AC application. For an AC application, shown by FIG. 1B, system 100 is the same except that a SSPC field-effect transistor (FET) switch 504 includes at least two FETs in a 'back to back' arrangement to allow switching of the AC in both polarities. Additional SSPC FETs can be arranged in parallel with one another. Additionally, a leakage switch 510 would also then have 'back to back' FETs to switch the leakage switch 510 "ON" and "OFF." Those skilled in the art will readily appreciate that an isolation barrier 513 can also be included on lead 120.

With continued reference to FIG. 1A, the feed input 112 is electrically connected to the SSPC FET switch 104. The load output 114 is electrically connected between the current sense resistor 106 and the resistor 108. The current sense resistor 106 is used to determine when and how much current is flowing from the SSPC FET switch 104 and the load output 114. The system 100 includes a first current sense lead 116 extending from between the SSPC FET switch 104 and the current sense resistor 106. A second current sense lead 118 extends from between the current sense resistor 106 and the resistor 108. A processing unit 102 is electrically coupled to the first and second current sense leads 116 and 118, respectively. Processing unit 102 includes signal conditioning circuitry and an A/D (analog to digital converter). The processing unit 102 operates to use the differential voltage measurement to determine the load current at the load output 114. The processing unit 102 is electrically coupled to the leakage switch 110. The leakage switch 110 is connected to the processing unit 102 by way of a leakage switch lead 120. The processing unit 102 electrically coupled to the SSPC FET switch 104.

System 100 operates to pseudo randomly turn the leakage switch 110 "ON" while the load is operating and performing an autocorrelation function to extract the leakage current measurement from the load current measurement and compare it to the expected value of the leakage circuit. By using the small value of the leakage current and measuring it over a number of samples, system 100 and the method 200, described below, are able to evaluate the measured value of the leakage current and use that to test whether the current sense resistor is operating properly. The pseudo randomness of when the leakage circuit is "ON" or "OFF" helps to avoid being interfered with by any repetitive regular noise from the load of system 100.

As shown in FIG. 1A, the processing unit 102 includes an accumulator 122, e.g. a leakage accumulator, and a counter 124. Leakage accumulator 122 operates to 'accumulate' the current readings after each load cycle to keep a running count across a group of cycles. For example, if the leakage switch 110 is "ON", the current reading is added to the leakage accumulator 122 value and if the switch 104 is "OFF", the current reading from is subtracted from the leakage accumulator 122. Ultimately, by making the same number of measurements "ON" and "OFF," this results in an accumulated current value that is representative of an accumulated leakage current value over however many "ON/OFF" cycles have passed. The accumulator 122 and its function is described in more detail below. The counter 124 operates to count the number of PN cycles conducted. For example, 256 PN cycles, is equivalent to 128 samples "ON" and 128 samples "OFF," which would result in 128 accumulated leakage current values.

Figure 2:
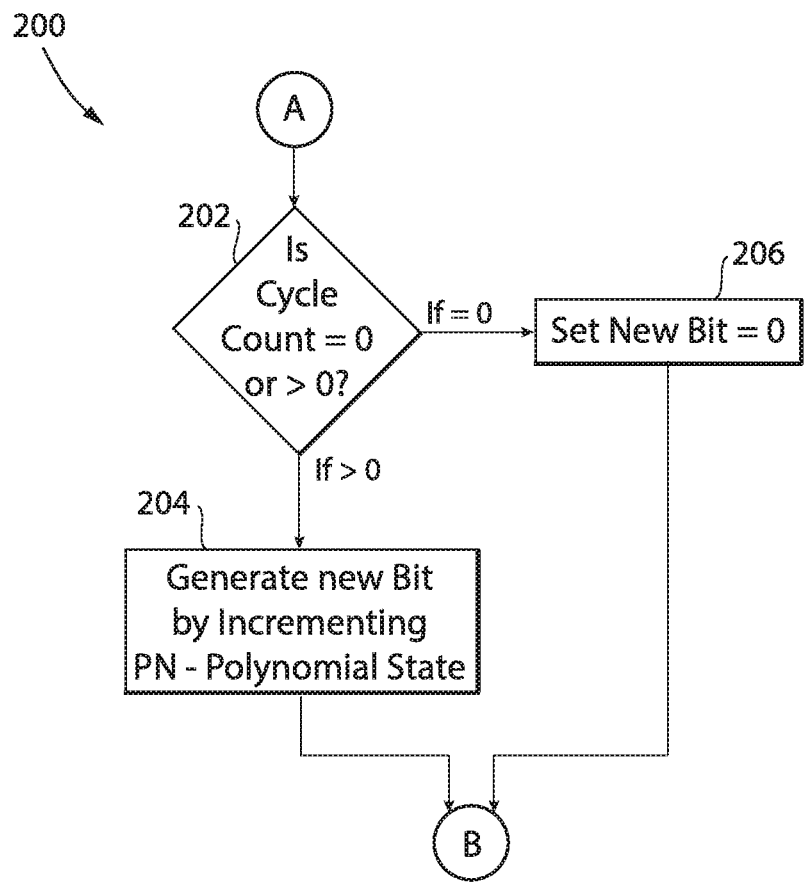
FIGS. 2-6 are flow charts schematically depicting a method for testing the system of FIGS. 1A-1B in accordance with embodiments of the present disclosure.

As shown in FIG. 2, a method 200 for testing a current sense resistor value, e.g. a value at current sense resistor 106, in a solid-state power controller (SSPC) system, e.g. system 100, is shown as starting at part "A" and includes determining a cycle count value of a cycle counter, e.g. counter 124, as indicated schematically by box 202. The method 200 includes generating a new bit with a processing unit, e.g. processing unit 102. If the cycle count is greater than zero, generating the new bit with the processing unit includes generating the new bit by incrementing polynomial (PN) state, as indicated schematically by box 204. This means generating a pseudo random PN bit. If the cycle count is equal to zero, generating the new bit with the processing unit includes setting the new bit to zero, as indicated schematically by box 206. The reason for the special case of the count=0 is that a maximum length PN polymonial generates $2^N-1$ states including 1 more '1' state than '0' states. The extra '0' at count=0 then exactly balances the number of "ON" and "OFF" samples. The generated bit is then passed on to the next stage of method 200, as indicated schematically by "B."

Figure 6:
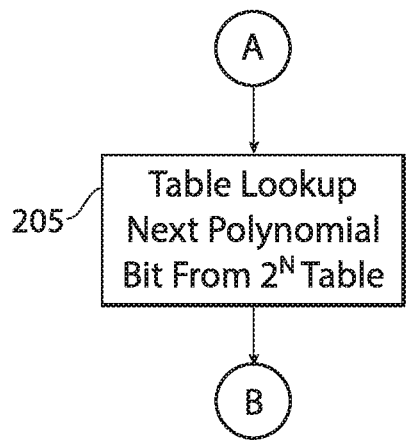

In accordance with some embodiments, instead of determining the cycle count and generating a new bit as shown in FIG. 2. As shown in FIG. 6, generating a new bit with the processing unit includes looking up the next PN bit from a $2^n$ polynomial look up table, as indicated schematically by box 205. The polynomial lookup table produces the same result output to the switch as generating the bit by incrementing a polynomial state (as shown schematically by box 204) but may be simpler and quicker to implement for some applications.

Figure 3:
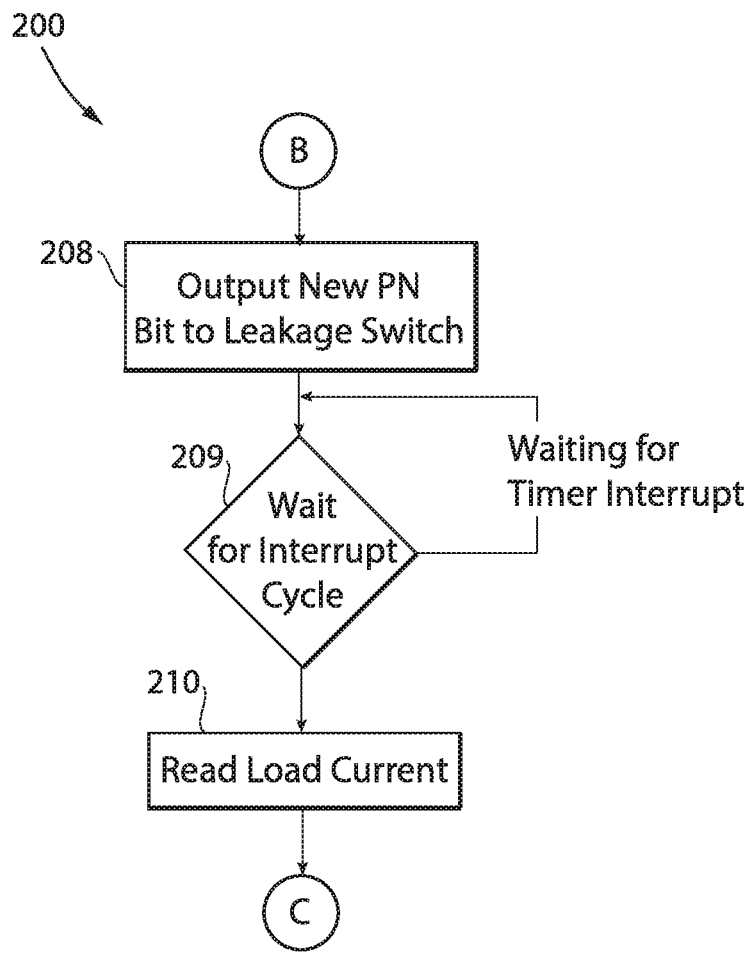

With reference now to FIG. 3, the continuation of method 200 from FIG. 2 is shown. The method 200 includes outputting the new bit (either from box 204 or 206) to a switch, e.g. leakage switch 110, operatively connected to the processing unit to at least one of turn the switch on or turn the switch off, as indicated schematically by box 208. If the PN bit is zero, the switch is turned "OFF" and if the PN bit is one, the switch is turned "ON." Due to the pseudo randomness of the PN bit generation (e.g. either a zero or a one), whether the switch is "ON" or "OFF" is random over a given number of cycles.

With reference now to FIG. 3, after outputting the new PN bit, the method 200 includes waiting for a given duration set by the interrupt cycle, as indicated by box 209. The timing interrupt signals when the leakage switch goes "ON" or "OFF." After the end of the interrupt cycle and after the new current level has settled and the differential voltage into the CPU 102 is stable, the method 200 includes reading a current across a current sense resistor, e.g. current sense resistor 106, as indicated schematically by box 210, with the processing unit at regular intervals and processing the data through an autocorrelation algorithm to determine whether the current sense resistor is operating within a desired resistance range. This reading is eventually done for a series of cycles, e.g. 256 cycles, such that method 200 acts to use a long sequence of pseudo random current readings to determine whether or not the current sense resistor is working. After the load current is read, the method 200 proceeds to the next stage of method 200, as indicated schematically by "C."

Figure 4:
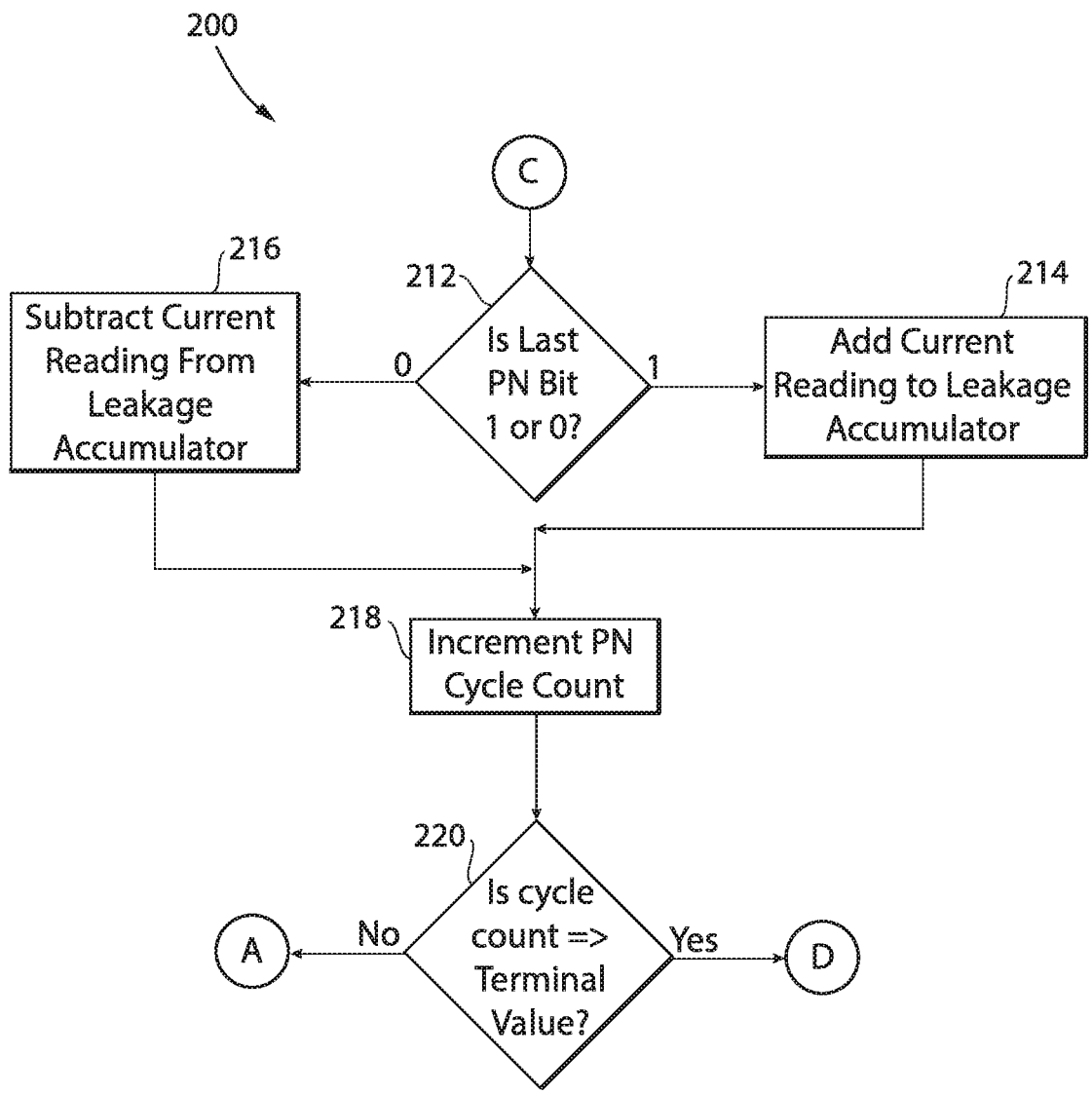

As shown in FIG. 4, after reading the current, determining whether the current sense resistor is operating within a desired resistance range includes determining whether the previous PN bit is 0 or 1, as indicated schematically by box 212. If the previous PN bit was 1, meaning that the switch was "ON" for the reading of the load current, method 200 includes adding the load current reading to a leakage accumulator, e.g. leakage accumulator 122, as indicated schematically by box 214. If the previous PN bit was zero, meaning that the switch was "OFF" for the reading of the load current, method 200 includes subtracting the load current reading from the leakage accumulator as indicated schematically by box 216. After either adding or subtracting the load current, the method 200 includes incrementing to the cycle count kept by the counter, as indicated schematically by box 218. The method 200 includes determining whether the cycle count is equal to or greater than a terminal value, or less than the terminal value, as indicated schematically by box 220. If the cycle count is less than the terminal value of the sequence (e.g. the count is NOT terminal), method 200 includes going back to "A" of method 200 and performs another cycle, e.g. determining the cycle count as shown schematically by box 202, and generating another new bit, as schematically shown by box 204.

As described above, once the terminal cycle count of the sequence has been reached, e.g. after 256 PN bits, where there are equal numbers of PN bits that were one and zero, the value ultimately added to the accumulator is an accumulated leakage current value that is representative of an accumulated leakage current value over however many "ON" cycles have passed, e.g. 128 "ON" cycles for a 256 cycle sequence. Those skilled in the art will readily appreciate that this is due to the fact that when the leakage switch is "ON," the current measured is equivalent to the leakage current plus the load current and when the leakage switch is "OFF," the current measured is equal to just the load current. Because the accumulator adds the current measurement when the leakage switch is "ON" (+leakage current and +load current) and subtracts the current measurement when the leakage switch is "OFF" (−load current), the value ultimately accumulated in the accumulator at the end of the PN cycle count, is the (+leakage current)×N/2 where N is the total number of cycles in the sequence. The counter operates to count the number of PN cycles conducted. For example, 256 PN cycles, is equivalent to 128 "ON" cycles and 128 "OFF" cycles all randomly mixed up in time, which would result in 128 accumulated leakage current values. The accumulated leakage current values allow for an autocorrelation function implemented by method 200 that allows for an accurate measurement of very low current sense resistor values.

Figure 5:
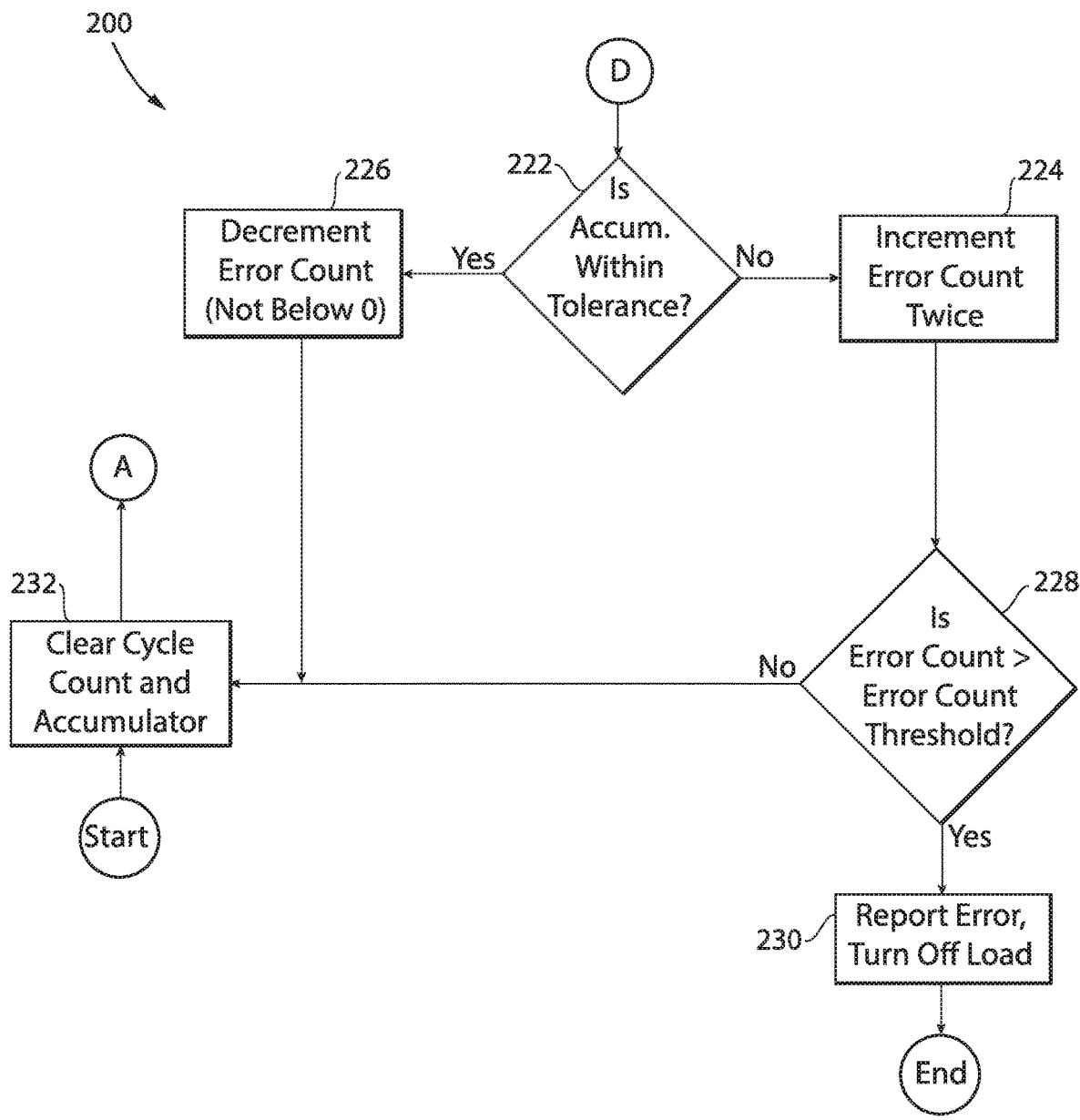

As shown in FIGS. 4-5, if the cycle count is equal to or greater than the terminal value method 200 goes to part "D" and the method 200 includes determining whether an accumulator value in the processing unit is within a tolerance threshold, as indicated schematically by box 222. The tolerance threshold can be set based on the expected accumulated leakage current value for the current sense resistor. The method 200 includes decrementing an error count toward zero, but not below zero, if the accumulator is within the tolerance threshold, as indicated schematically by box 226. After decrementing the error count, method 200 includes clearing the cycle count and the leakage accumulator value, as indicated schematically by box 232. The method can then return to part "A" and start a new sequence of cycles, e.g. return to determining a cycle count value of a cycle counter, e.g. counter 124, as indicated schematically by box 202, and repeat the process over and over confirming the status of the current sense resistor. The reason for repeating the sequence many times is that, on a single sequence, noise and load fluctuations can result in an erroneous or false detection of a current sense resistor fault. The dual slope integrator described here then assures that more than ½ of the time the sequence has failed the current sense resistor before it is actually reported and acted on.

As shown in FIG. 5, the method 200 includes incrementing an error count if the accumulator is outside of the tolerance threshold, as indicated schematically by box 224. Incrementing the error count includes incrementing the error count twice. Those skilled in the art will readily appreciate that there are a variety of other suitable methods and 'slopes' of detection algorithms that can be used here to avoid nuisance faults. For example the increment could be by 3 or 4, instead of just two, thus resulting in a quicker detection but with less assurance. The method 200 includes determining whether a total error count is greater or less than a pre-determined error count threshold, as indicated schematically by box 228. The method 200 includes reporting an error and turning off a load to a solid-state power controller (SSPC) system if the total error count is greater than the pre-determined error count threshold, as indicated schematically by box 230. If the total error count is equal to or less than the pre-determined error count threshold, method 200 includes clearing the cycle count and the leakage accumulator value, as indicated schematically by box 232. The method can then return to the beginning, e.g. return to determining a cycle count value of a cycle counter, e.g. counter 124, as indicated schematically by box 202.

The methods and systems of the present disclosure, as described above and shown in the drawings, provide for SSPC systems with a built-in-test circuit having superior properties including improved test sensitivity. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. A solid-state power controller (SSPC) system with a built-in-test circuit:
   a SSPC field-effect transistor (FET) switch;
   a current sense resistor electrically connected to the SSPC FET switch in series;
   a resistor electrically connected to the current sense resistor in series;
   a switch electrically connected to the resistor in series operative to test the current test resistor while the SSPC system is operating a load;
   a load output electrically connected between the current sense resistor and the resistor, wherein the current sense resistor is connected in series between the SSPC FET switch and the load output; and
   a processing unit electrically coupled to the first and second current sense leads and the switch, wherein the processing unit is configured and adapted to randomly generate a new bit and output the new bit to the switch to at least one of turn the switch on or turn the switch off.

2. The system as recited in claim 1, further comprising a feed input electrically connected to the SSPC FET switch.

3. The system as recited in claim 1, further comprising a first current sense lead extending from between the SSPC FET switch and the current sense resistor and a second current sense lead extending from between the current sense resistor and the resistor.

4. The system as recited in claim 1, wherein the processing unit is electrically coupled to the SSPC FET switch.

5. The system as recited in claim 1, wherein the processing unit includes an accumulator and a counter.

* * * * *